United States Patent
Seo et al.

(10) Patent No.: US 7,524,733 B2
(45) Date of Patent: Apr. 28, 2009

(54) ASYMMETRIC SOURCE/DRAIN TRANSISTOR EMPLOYING SELECTIVE EPITAXIAL GROWTH (SEG) LAYER AND METHOD OF FABRICATING SAME

(75) Inventors: Hyeoung-Won Seo, Gyeonggi-do (KR); Nak-Jin Son, Gyeonggi-do (KR); Du-Heon Song, Gyeonggi-do (KR); Jun Seo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 87 days.

(21) Appl. No.: 11/735,919

(22) Filed: Apr. 16, 2007

(65) Prior Publication Data
US 2007/0190734 A1 Aug. 16, 2007

Related U.S. Application Data

(62) Division of application No. 11/067,410, filed on Feb. 25, 2005, now Pat. No. 7,221,023.

(30) Foreign Application Priority Data
Feb. 27, 2004 (KR) ............................. 2004-13684

(51) Int. Cl.
*H01L 21/76* (2006.01)
(52) U.S. Cl. .................. 438/418; 438/197; 438/381; 438/942; 438/745; 257/E21.229; 257/E21.304; 257/E21.314; 257/E21.646
(58) Field of Classification Search ............... 438/197, 438/381, 418, 692, 700, 734, 745, 766, 783, 438/942
See application file for complete search history.

(56) References Cited

U.S. PATENT DOCUMENTS
6,211,026 B1 * 4/2001 Ahmad et al. ............... 438/300
(Continued)

FOREIGN PATENT DOCUMENTS
JP 07-283410 10/1995
(Continued)

OTHER PUBLICATIONS
English language abstract of Japanese Publication No. 07-283410.
(Continued)

*Primary Examiner*—David Nhu
(74) *Attorney, Agent, or Firm*—Marger Johnson & McCollom, P.C.

(57) ABSTRACT

According to some embodiments of the invention, a method includes preparing a semiconductor substrate having an active region, doping channel ions in the active region, forming a planarized selective epitaxial growth (SEG) layer in a predetermined region of the active region doped with the channel ions, sequentially forming a gate insulating layer, a gate conductive layer and a gate hard mask layer on the semiconductor substrate having the planarized SEG layer, forming a gate pattern crossing the active region by sequentially patterning the gate hard mask layer and the gate conductive layer, the planarized SEG layer being located at one side of the gate pattern, and forming source/drain regions by implanting impurity ions using the gate pattern as an ion implantation mask. Accordingly, there is provided an asymmetric source/drain transistor capable of preventing a leakage current by diffusing the channel ions into the SEG layer.

11 Claims, 12 Drawing Sheets

U.S. PATENT DOCUMENTS

| | | |
|---|---|---|
| 6,261,911 B1 | 7/2001 | Lee et al. |
| 6,455,366 B1 * | 9/2002 | Lee .............................. 438/241 |
| 6,596,594 B1 | 7/2003 | Guo |
| 6,890,823 B2 | 5/2005 | Lee et al. |
| 7,002,223 B2 | 2/2006 | Kwon |
| 7,029,989 B2 | 4/2006 | Kim et al. |
| 7,057,238 B2 | 6/2006 | Kim et al. |
| 7,221,023 B2 * | 5/2007 | Seo et al. ..................... 257/347 |

FOREIGN PATENT DOCUMENTS

| | | |
|---|---|---|
| KR | 1999-0081382 | 11/1999 |
| KR | 1999-0086528 | 12/1999 |

OTHER PUBLICATIONS

English language abstract of Korean Publication No. 1999-0081382.
English language abstract of Korean Publication No. 1999-0086528.

* cited by examiner

US 7,524,733 B2

ASYMMETRIC SOURCE/DRAIN TRANSISTOR EMPLOYING SELECTIVE EPITAXIAL GROWTH (SEG) LAYER AND METHOD OF FABRICATING SAME

CROSS REFERENCE TO RELATED APPLICATIONS

This application is a divisional of U.S. patent application Ser. No. 11/067,410, filed 25 Feb. 2005, now U.S. Pat. No. 7,221,023 B2, which claims priority from Korean Patent Application No. 2004-13684, filed 27 Feb. 2004, the contents of which are hereby incorporated by reference in their entirety for all purposes.

BACKGROUND OF THE INVENTION

1. Field of the Invention

This disclosure relates to a method of fabricating a semiconductor device and semiconductor device fabricated thereby and, more particularly, to a method of fabricating an asymmetric source/drain transistor employing a selective epitaxial growth (SEG) layer and asymmetric source/drain transistor fabricated thereby.

2. Description of the Related Art

A semiconductor device generally employs a discrete device such as a MOS transistor as a switching device. As the degree of integration of the semiconductor device increases, the size of the MOS transistor decreases. As a result, the channel length of the MOS transistor decreases to the point that a short channel effect may occur.

Generally, channel ions are doped into the channel region to a high concentration in order to prevent a threshold voltage from decreasing due to the short channel effect. However, when the channel ions are doped to the high concentration, channel resistance increases so that current driving capability is decreased. Also, the increase in concentration of the channel ions leads to an increased electric field between a channel region and source/drain regions. Accordingly, a leakage current between the channel region and the source/drain regions increases. In particular, in a case where a capacitor stores charge, such as when a DRAM cell is connected to a source or a drain, the increase of the leakage current causes degradation of charge retention characteristics.

Methods for preventing the degradation of the charge retention characteristics due to the increase of the electric field between the channel region and the source/drain regions have been widely studied. In particular, methods of fabricating an asymmetric source/drain transistor may be capable of reducing the electric field between the source or drain region to which a capacitor is connected and the channel region while maintaining a constant threshold voltage.

A method of fabricating an asymmetric source/drain transistor appears in U.S. Pat. No. 6,596,594 to Guo entitled "Method for Fabricating Field Effect Transistor (FET) Device with Asymmetric Channel Region and Asymmetric Source and Drain Regions". According to this method, the asymmetric source/drain regions are formed by performing ion implantation processes.

However, one drawback of forming the asymmetric channel region or the asymmetric source/drain regions with an ion implantation processes is that it is difficult to control impurity ions that diffuse into the channel region.

Embodiments of the invention address these and other disadvantages of the conventional art.

SUMMARY OF THE INVENTION

One embodiment of the invention provides a method of fabricating an asymmetric source/drain transistor capable of improving a short channel effect by distributing channel ions asymmetrically.

Another embodiment of the invention provides a method of fabricating a transistor capable of distributing channel ions asymmetrically with ease.

Yet another embodiment of the invention provides an asymmetric source/drain transistor capable of distributing channel ions asymmetrically with ease.

BRIEF DESCRIPTION OF THE DRAWINGS

The foregoing and other objects, features, and advantages of the invention will be apparent from the written description of exemplary embodiments of the invention that follow, when considered in conjunction with the following figures. The drawings are not necessarily to scale, emphasis is instead placed upon clearly illustrating the principles of the invention.

DETAILED DESCRIPTION OF THE INVENTION

Figure 1:
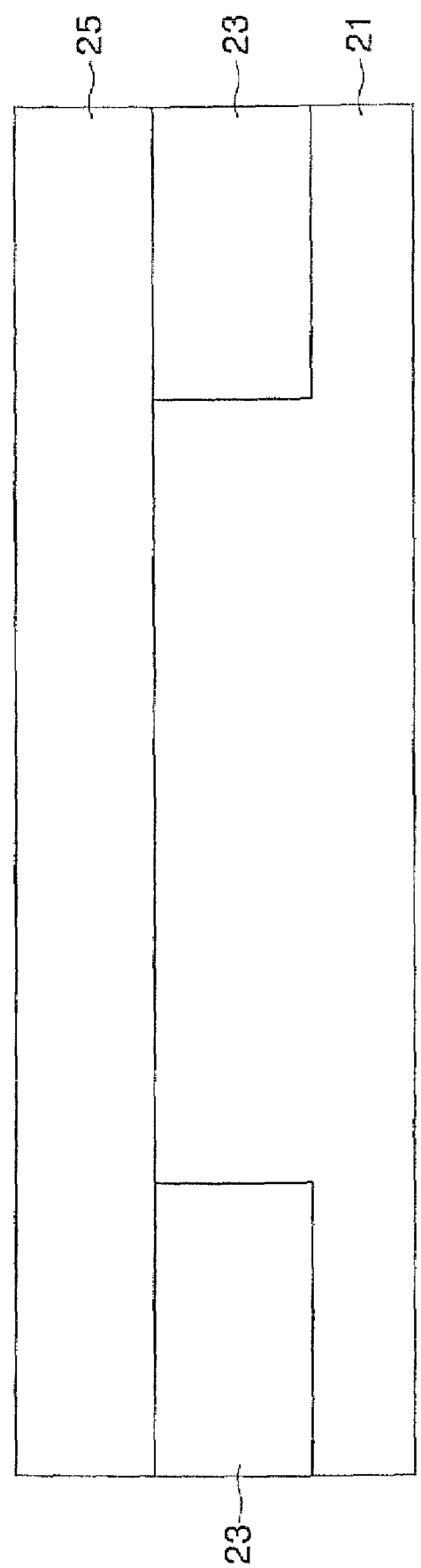
FIGS. 1 to 8 are cross-sectional diagrams illustrating a method of fabricating an asymmetric source/drain transistor in accordance with some embodiments of the invention.

The invention is described below with reference to the accompanying drawings, in which exemplary embodiments of the invention are shown. In the drawings, the thickness of the layers and regions are exaggerated for clarity.

FIGS. 1 to 8 are cross-sectional diagrams illustrating a method of fabricating an asymmetric source/drain transistor in accordance with some embodiments of the invention.

Referring to FIG. 1, an isolation layer 23 for defining an active region is formed on a semiconductor substrate 21. The isolation layer 23 may be formed by a shallow trench isolation (STI) process.

Channel ions are doped on the semiconductor substrate having the isolation layer 23. The channel ions are distributed in the active region and may be N-type or P-type depending on what type of transistor is to be formed on the active region. That is, if the transistors to be formed on the active region are NMOS transistors and PMOS transistors, the channel ions are P-type and N-type, respectively. The channel ions may be doped before the isolation layer 23 is formed.

A hard mask layer 25 is formed on the semiconductor substrate having the channel ions. The hard mask layer 25 may be an oxide layer, a nitride layer, or an inorganic antireflective coating (ARC) layer. Also, the hard mask layer 25 may be composed of multiple individual layers that are sequentially stacked. For example, the hard mask layer 25 may be formed by sequentially stacking an oxide layer and a polysilicon layer.

Figure 2:
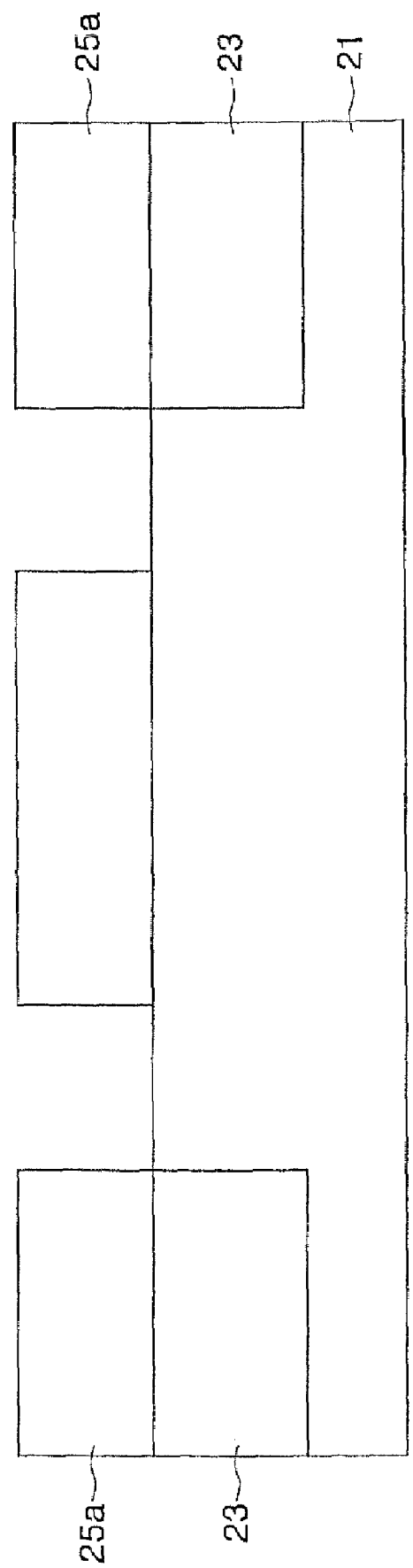

Referring to FIG. 2, the hard mask layer 25 is patterned to form a hard mask pattern 25a having an opening exposing predetermined regions of the active region. At this time, the hard mask pattern 25a may be formed in a line type, and the isolation layer 23 may be exposed. Meanwhile, the hard mask layer 25 may be patterned by photolithography and etching processes.

Figure 3:
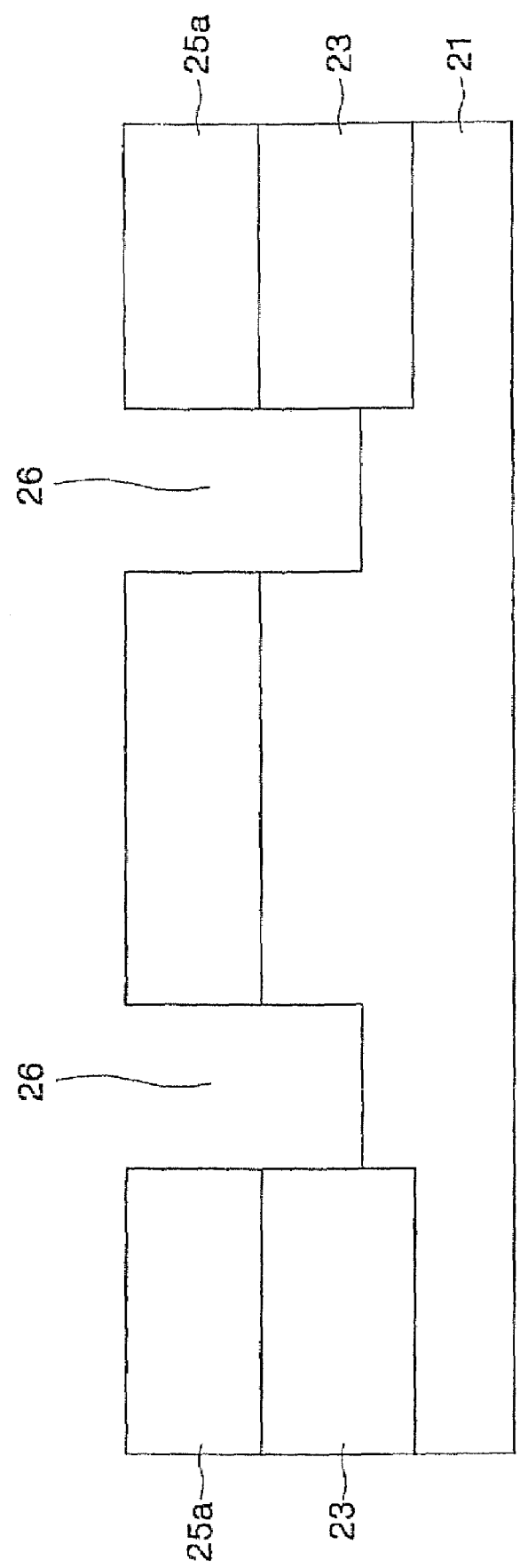

Referring to FIG. 3, the active region is etched using the hard mask pattern 25a as an etching mask to form trenches 26.

It is desirable that the trenches 26 are formed to a depth of the active region that includes most of the channel ions. Accordingly, most of the channel ions in the active region where the trenches 26 are formed are removed.

Figure 4:
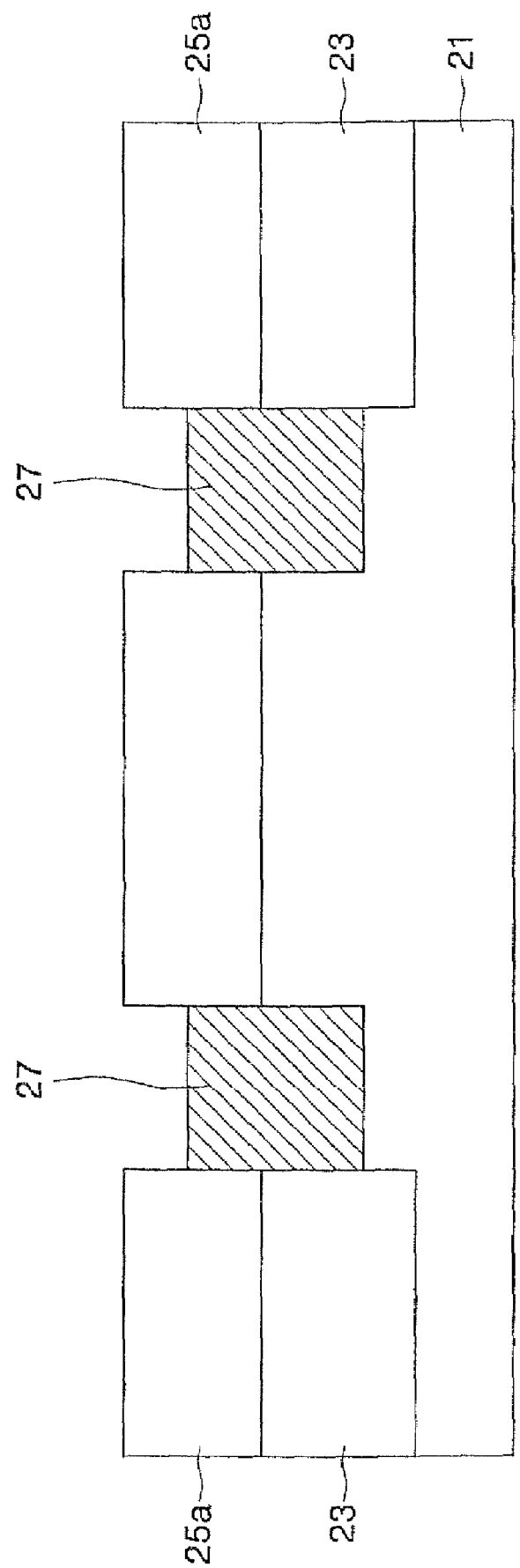

Referring to FIG. 4, SEG layers 27 are formed to fill the trenches 26. The SEG layers 27 fill the trenches 26 and may also protrude from the top of the semiconductor substrate 21. When the SEG layers 27 are formed, it is desirable to prevent impurity ions having the same type as the channel ions from being doped into the SEG layers 27. However, while the SEG layers 27 are formed, the impurity ions having the same type as the channel ions may be doped to a concentration lower than that of the channel ions.

Figure 5:
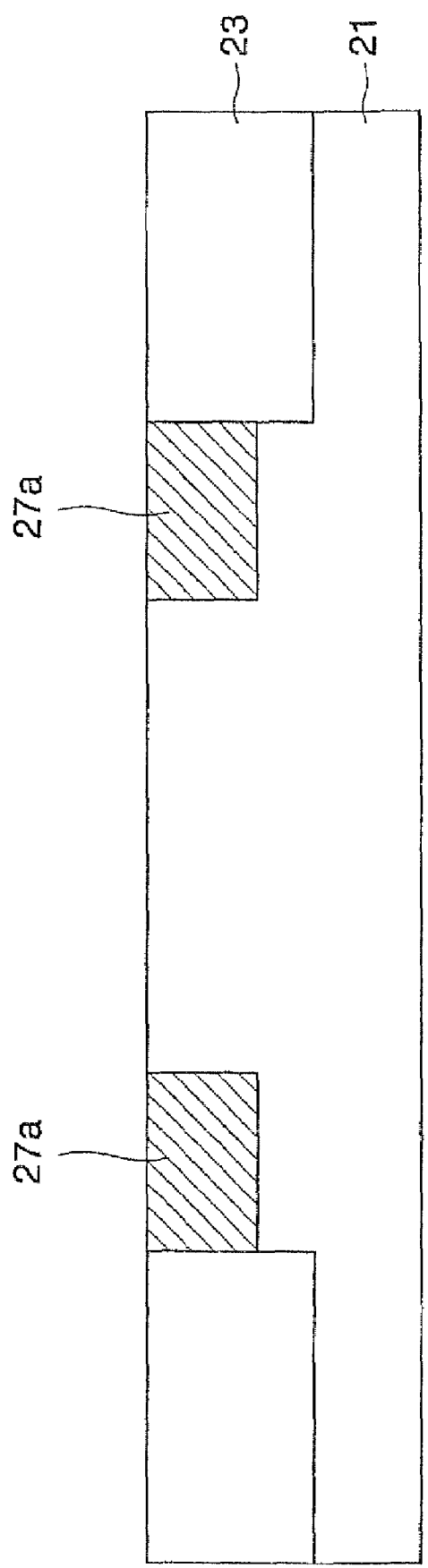

Referring to FIG. 5, after the SEG layers 27 are formed, the hard mask pattern 25a is removed. The hard mask pattern 25a may be removed by a wet etching process. Then, the SEG layers 27 that protrude from the top of the semiconductor substrate 21 may be planarized to form planarized SEG layers 27a. The planarization of the SEG layers 27 may be performed by a polishing process such as a chemical-mechanical polishing (CMP) process.

Alternatively, when the SEG layers 27 do not protrude from the top of the semiconductor substrate 21, the planarization process is omitted.

Figure 6:
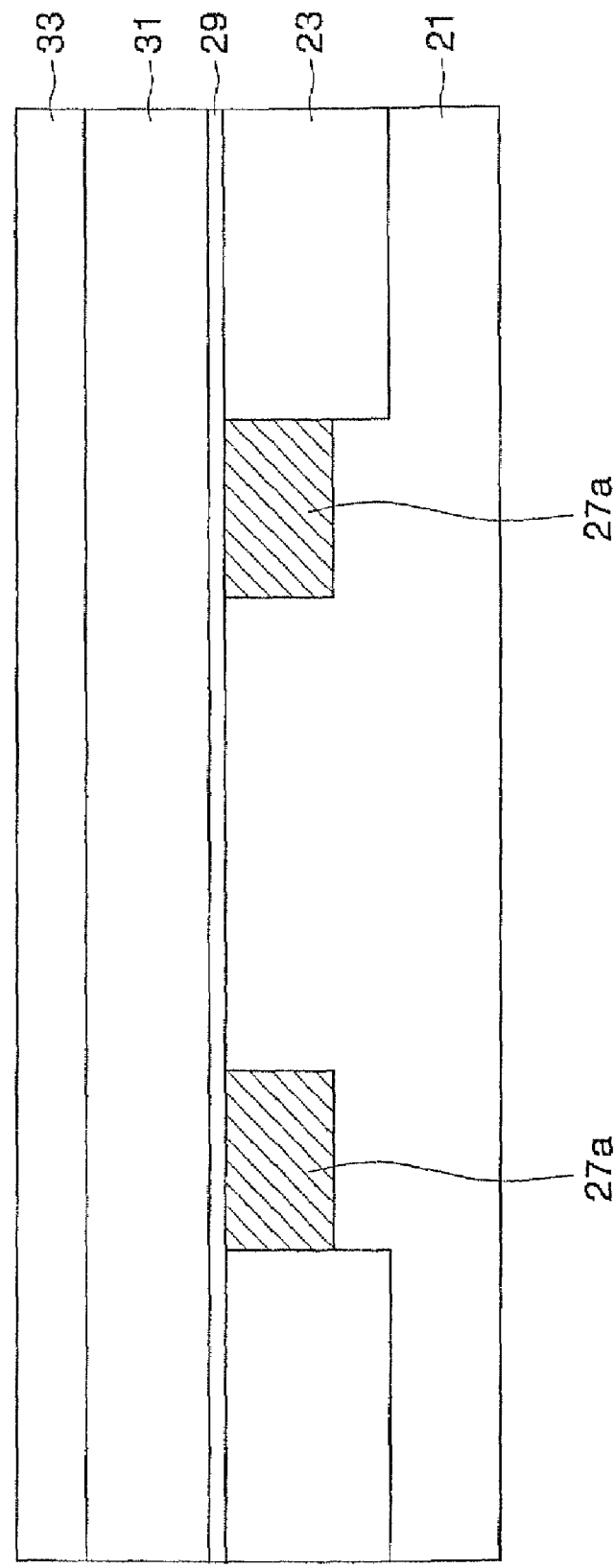

Referring to FIG. 6, a gate insulating layer 29, a gate conductive layer 31, and a gate hard mask layer 33 are sequentially formed on the semiconductor substrate having the planarized SEG layers 27a.

The gate insulating layer 29 may be formed by a thermal oxidation process, an atomic layer deposition process, or a chemical vapor deposition process. When the gate insulating layer 29 is formed by the thermal oxidation process, the gate insulating layer 29 may be restricted to an upper surface of the planarized SEG layers 27a.

Meanwhile, the gate conductive layer 31 may be formed of a single layer or multiple layers. Preferably, the gate conductive layer 31 is composed of a polysilicon layer and a metal layer that are sequentially stacked.

The gate hard mask layer 33 is formed of a material layer having an etch selectivity with respect to the gate conductive layer 31. Preferably, the gate hard mask layer 33 includes a silicon nitride (SiN) layer.

Figure 7:
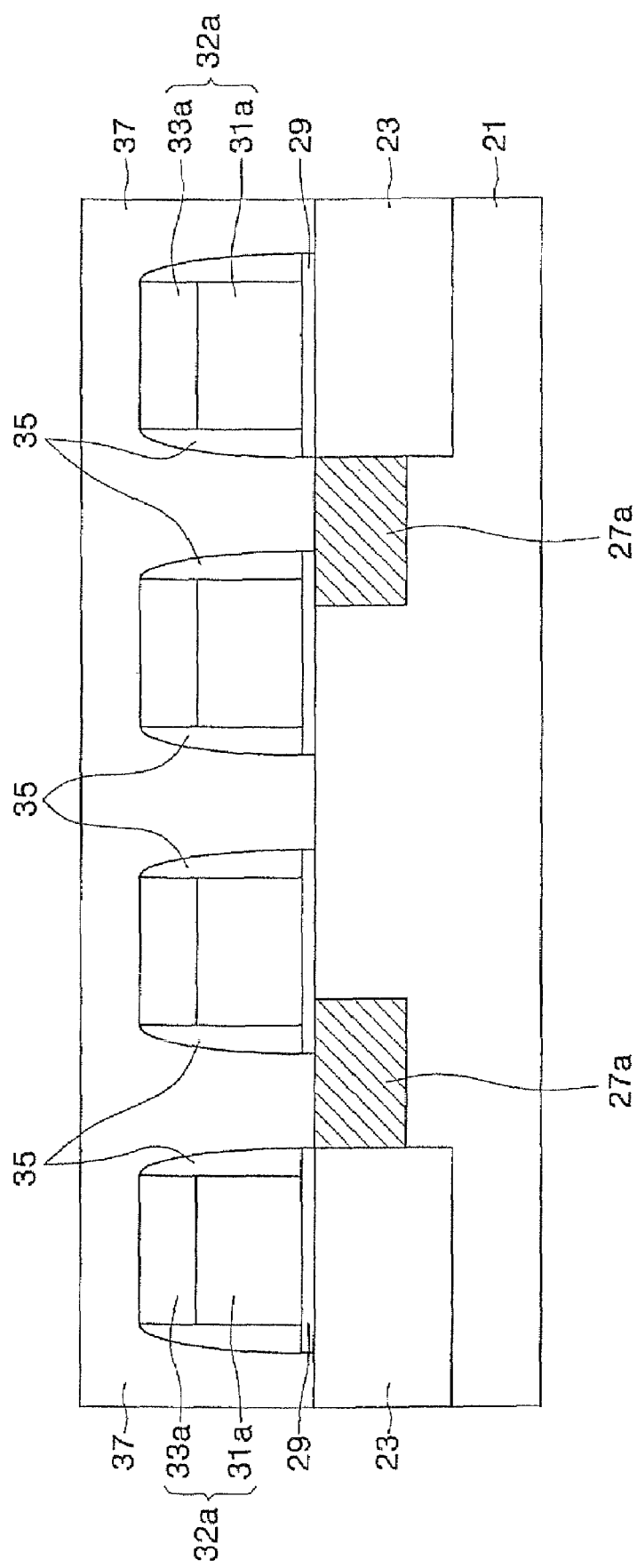

Referring to FIG. 7, the gate hard mask layer 33 and the gate conductive layer 31 are sequentially patterned to form gate patterns 32a. Each of the gate patterns 32a includes a gate hard mask pattern 33a and a gate electrode 31a. The gate patterns 32a may be formed by the following method. That is, the gate hard mask layer 33 is patterned by the photolithography and etching processes to form the gate hard mask patterns 33a. Then, the gate conductive layer 31 is etched using the gate hard mask patterns 33a as an etch mask to form the gate electrodes 31a. Meanwhile, while forming the gate electrodes 31a, the gate insulating layer 29 is exposed. The exposed gate insulating layer 29 is etched and removed while the gate electrodes 31a are formed.

Meanwhile, the gate patterns 32a are formed such that each of the planarized SEG layers 27a is located to one side of each of the gate patterns 32a. Also, the planarized SEG layers 27a are not formed at the opposite side corresponding to the one side where the planarized SEG layers 27a are located.

Preferably, the gate patterns 32a may be formed to overlap at least some portion of the planarized SEG layers 27a. Accordingly, it is possible to distribute the channel ions in the channel region more asymmetrically.

It is possible to form extension regions (not shown) and halos (not shown) by implanting impurity ions using the gate patterns 32a as an ion implantation mask. Also, source/drain regions (not shown) may be formed by implanting impurity ions using the gate patterns 32a as an ion implantation mask. It is commonly known that the terms source region and drain region have a relative meaning determined by a direction of the current in the transistor. Hereinafter, however, for convenience of an explanation, a region where the SEG layer is located is defined as a source region, and a region opposite to the source region is defined as a drain region.

Preferably, spacers 35 covering sidewalls of the gate patterns 32a may be formed before the source/drain regions are formed. The gate insulating layer 29 may be patterned while the spacers 35 are formed, as shown in FIG. 7. After that, the source/drain regions are formed by implanting the impurity ions into the substrate using the gate patterns 32a and the spacers 35 as an ion implantation mask.

Meanwhile, the source regions are mainly formed in the planarized SEG layers 27a, and the drain regions are formed in the active region of the semiconductor substrate 21. A channel region is formed between the source/drain regions.

An interlayer insulating layer 37 is formed on the semiconductor substrate having the source/drain regions. The interlayer insulating layer 37 may be formed of a silicon oxide layer.

Figure 8:
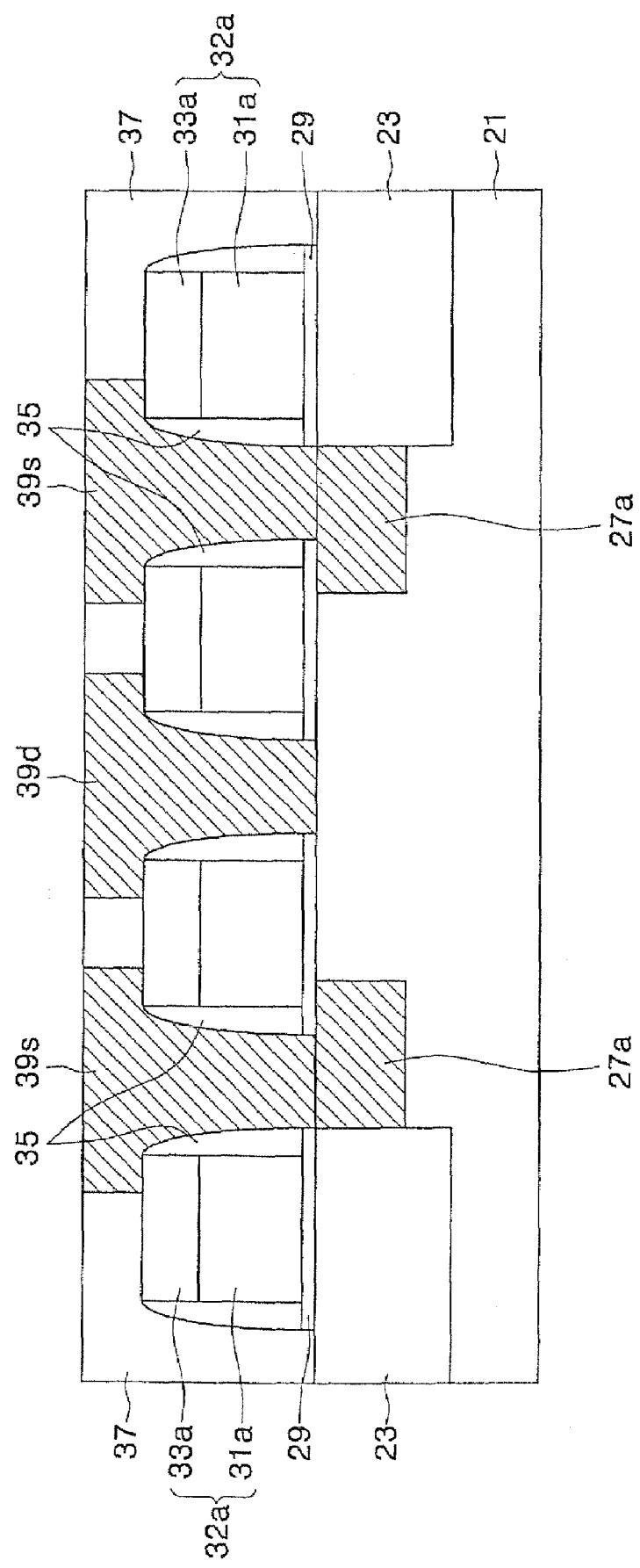

Referring to FIG. 8, contact holes that expose the source/drain regions are formed by patterning the interlayer insulating layer 37. The contact holes may be formed by a self-aligned contact process.

Subsequently, a conductive layer which fills the contact holes is formed. Source contact pads 39s and drain contact pads 39d are formed by planarizing the conductive layer until an upper surface of the interlayer insulating layer 37 is exposed. The source contact pads 39s are in contact with the planarized SEG layers 27a. Also, the drain contact pads 39d are electrically in contact with the drain region.

In the case of a DRAM cell, the contact pads 39d and 39s may be connected to a bit line and a capacitor for storing charges, respectively.

According to some embodiments of the invention, the channel ions doped in the channel regions may be diffused into the planarized SEG layers 27a. The channel ions are diffused while the SEG layer 27 is formed or the following processes are progressed. Therefore, channel ions with a concentration lower than that of the channel regions adjacent to the drains regions remain in the channel regions adjacent to the planarized SEG layers 27a. Accordingly, the intensities of electric fields of the source regions and the channel regions are reduced. Meanwhile, in the case where capacitors are connected to the source contact pads 39s as the DRAM cell, the electric field intensities of the source regions and the channel regions are reduced so that the charge storage capability of the capacitor is enhanced.

Hereinafter, an asymmetric source/drain transistor in accordance with an aspect of the present invention will be explained in detail.

Referring back to FIG. 8, an active region is defined on a semiconductor substrate 21. The active region may be defined by an isolation layer 23.

Gate patterns 32a cross the active regions. Each of the gate patterns 32a includes a gate electrode 31a and a gate hard mask pattern 33a which are sequentially stacked. The gate electrode 31a may be a single-layer structure or a multi-layered structure. Preferably, the gate electrode 31a is a multi-layered structure where a poly silicon layer and a metal layer are sequentially stacked.

Meanwhile, spacers 35 cover sidewalls of the gate patterns 32a. The spacers 35 may be a silicon nitride (SiN) layer, or a stacked layer of a silicon oxide ($SiO_2$) layer and a silicon nitride layer. A gate insulating layer 29 is interposed between the gate patterns 32a and the active region. The gate insulating layer 29 may be a silicon oxide layer or a high-k dielectric layer.

Meanwhile, SEG layers 27a are located in the active region. One of the spacers 35 overlaps at least some portion of the SEG layers 27a. That is, one of the spacers 35 covers at least some portion of the SEG layer 27a. Preferably, the gate patterns 32a overlap at least some portion of the SEG layers 27a.

On the other hand, source contact pads 39s and a drain contact pad 39d may be disposed adjacent to the sidewalls of the gate patterns 32a to be electrically connected to the active region. The source contact pads 39s are in contact with the SEG layers 27a, and the drain contact pad 39d is in contact with the semiconductor substrate 21. Meanwhile, the contact pads 39d and 39s are electrically insulated from each other by an interlayer insulating layer 37. Also, the interlayer insulating layer 37 fills empty spaces between the gate patterns 32a.

In the case of the DRAM cell, capacitors are electrically connected to each of the source contact pads 39s, and a bit line is electrically connected to the drain contact pad 39d.

According to an aspect of the invention, SEG layers 27a are located in the active region, and impurity ions in the channel region are diffused into the SEG layers 27a. Accordingly, there may be provided an asymmetric source/drain transistor in which channel ions are asymmetrically distributed.

FIGS. 9 to 12 are cross-sectional diagrams illustrating a method of fabricating an asymmetric source/drain transistor in accordance with other embodiments of the invention.

Figure 9:
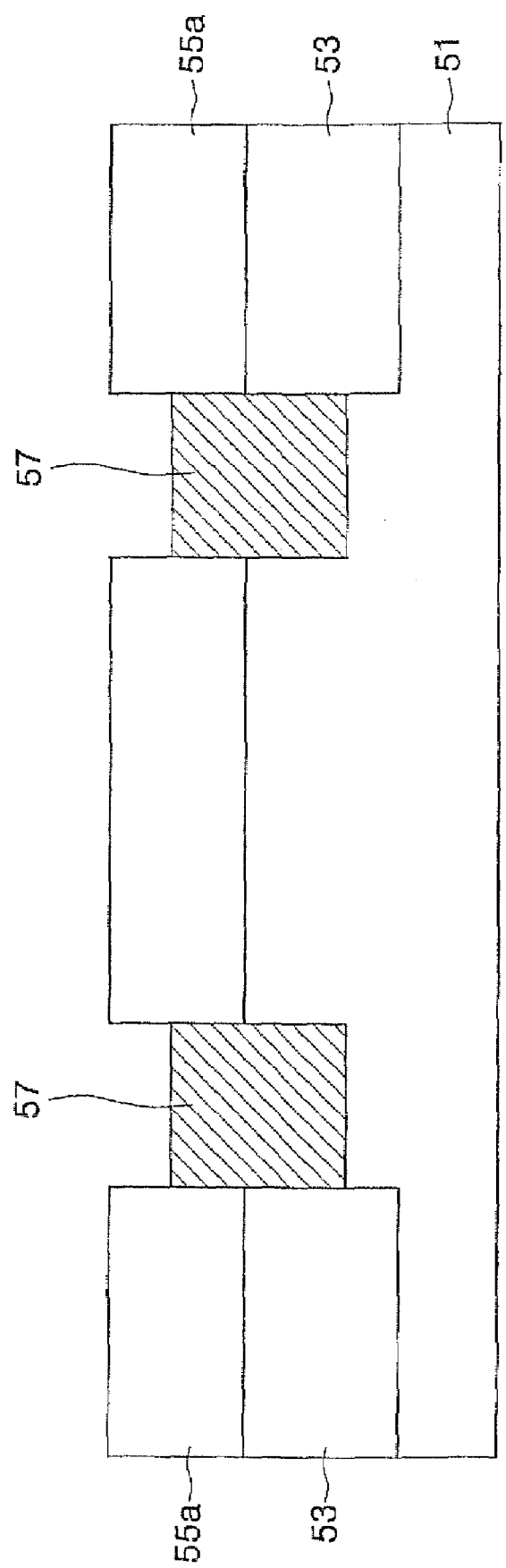
FIGS. 9 to 12 are cross-sectional diagrams illustrating a method of fabricating an asymmetric source/drain transistor in accordance with other embodiments of the invention.

Referring to FIG. 9, an isolation layer 53, a hard mask pattern 55a, and SEG layers 57 are formed on a semiconductor substrate 51 as described with reference to FIGS. 1 to 4. The SEG layers 57 protrude from the top of the semiconductor substrate 51.

Figure 10:
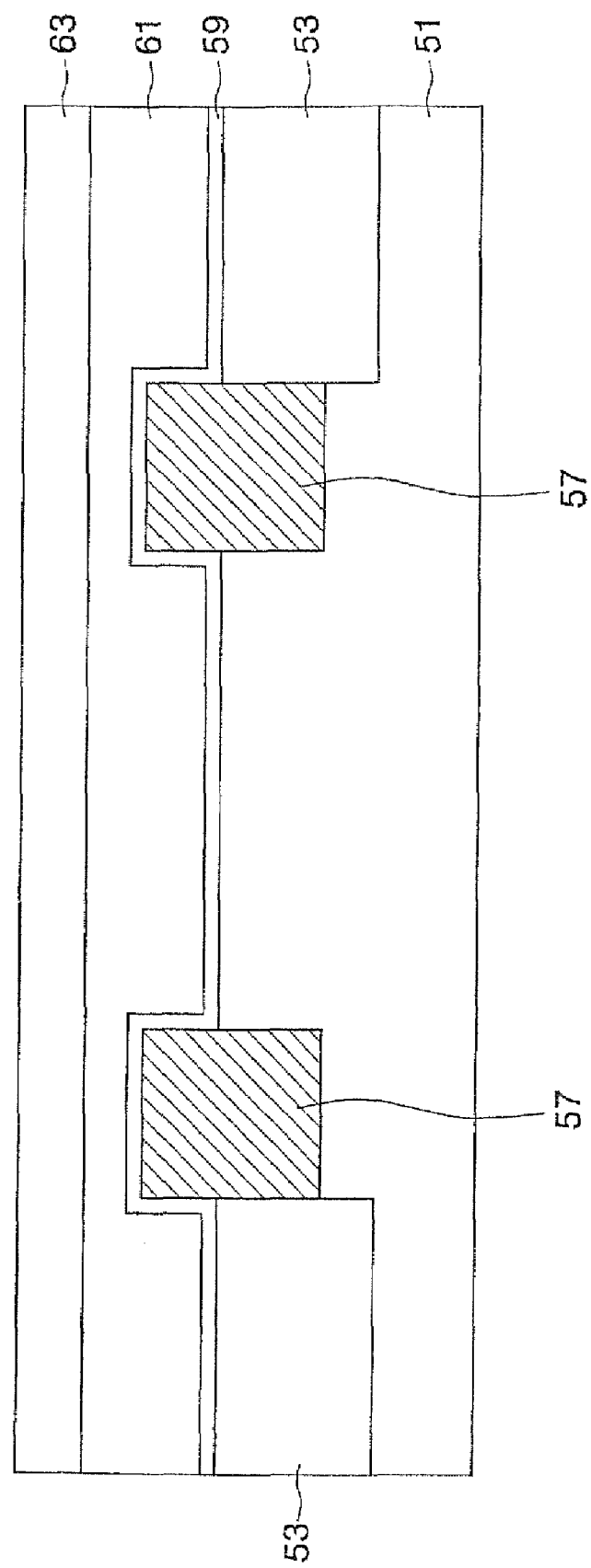

Referring to FIG. 10, the hard mask pattern 55a is removed. The hard mask pattern 55a may be removed by a wet etching process. Next, a gate insulating layer 59, a gate conductive layer 61, and a gate hard mask layer 63 are sequentially formed on the semiconductor substrate having the protruding SEG layers 57.

The gate insulating layer 59 may be formed by a thermal oxidation process, an atomic layer deposition process or a chemical vapor deposition process as described with reference to FIG. 6. In the case where the gate insulating layer 59 is formed by the thermal oxidation process, the gate insulating layer 59 may be restricted to an upper surface of the active region that includes the protruded SEG layers 57.

Meanwhile, the gate conductive layer 61 may be composed of a single layer or multiple layers. Preferably, the gate conductive layer 61 is composed of a polysilicon layer and a metal layer that are sequentially stacked. Furthermore, it is desirable that the gate conductive layer 61 is conformably formed. While, the gate conductive layer 61 may be planarized by a polishing process such as a chemical-mechanical polishing (CMP) process.

The gate hard mask layer 63 is formed of a material layer having an etch selectivity with respect to the gate conductive layer 61. Preferably, the gate hard mask layer 63 may include a silicon nitride (SiN) layer.

Figure 11:
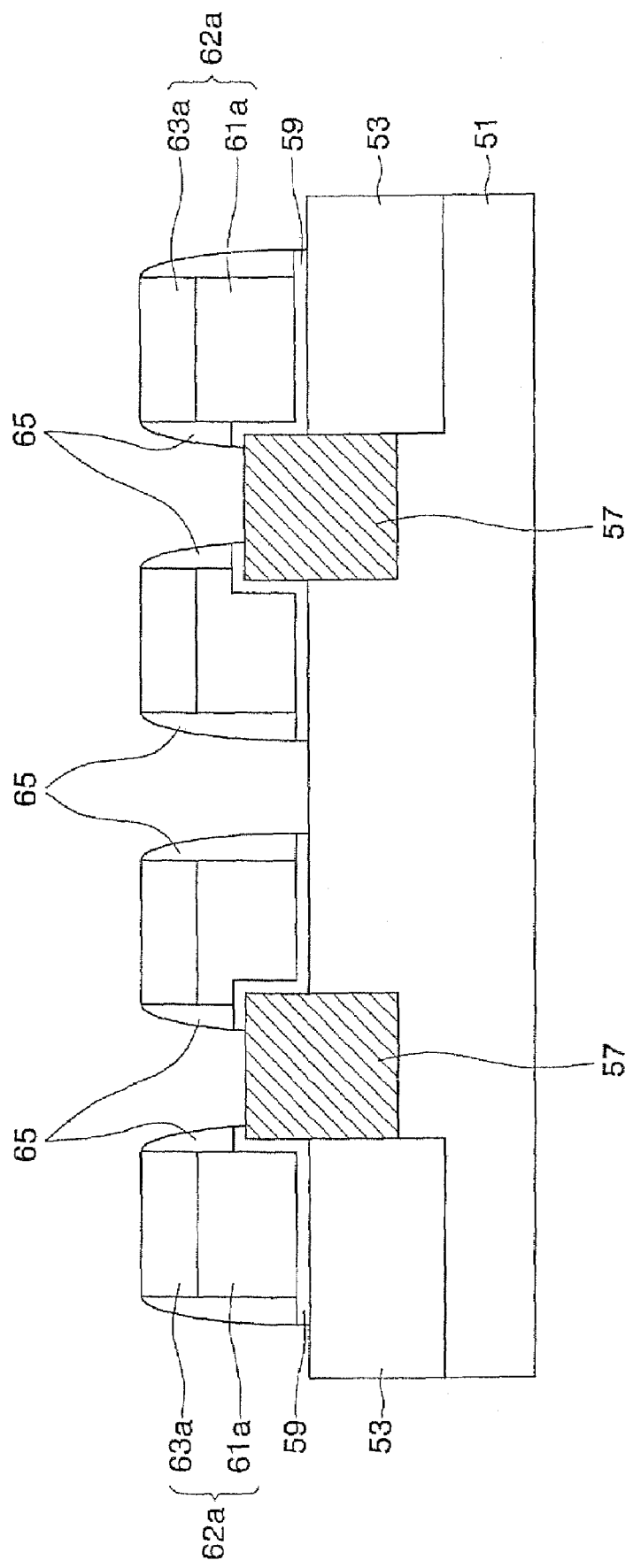

Referring to FIG. 11, gate patterns 62a are formed by sequentially patterning the gate hard mask layer 63 and the gate conductive layer 61. Each of the gate patterns 62a includes gate hard mask patterns 63a and gate electrodes 61a. The gate patterns 62a may be formed by the following method. That is, the gate hard mask layer 63 is patterned by photolithography and etching processes to form the gate hard mask patterns 63a. Then, a gate conductive layer 61 is etched using the gate hard mask patterns 63a as an etching mask to form the gate electrodes 61a. Meanwhile, while forming the gate electrodes 61a, the gate insulating layer 59 is exposed. The exposed gate insulating layer 59 may be etched and removed while the gate electrodes 61a are formed.

Meanwhile, the gate patterns 62a are formed such that each of the protruded SEG layers 57a is located to one side of each of the gate patterns 62a. Also, the SEG layers 57a are not formed at the opposite side corresponding to the one side where the protruded SEG layers 57a are located.

Preferably, the gate patterns 62a may be formed to overlap at least some portion of the protruded SEG layers 57. Accordingly, it is possible to distribute channel ions in the channel region more asymmetrically.

It is possible to form extension regions (not shown) and halos (not shown) by implanting impurity ions using the gate patterns 62a as an ion implantation mask. Also, it is possible to form source/drain regions (not shown) by implanting impurity ions using the gate patterns 62a as an ion implantation mask. Preferably, spacers 65 covering sidewalls of the gate patterns 62a may be formed before the source/drain regions (not shown) are formed. The gate insulating layer 59 may be patterned while the spacers 65 are formed as shown in FIG. 11. After then, the source/drain regions are formed by implanting the impurity ions into the substrate using the gate patterns 62a and the spacers 65 as an ion implantation mask.

Meanwhile, the source regions are formed in the protruded SEG layers 57, and the drain regions are formed in the active regions of the semiconductor substrate 51. A channel region is formed between the source region and the drain region. Since the source regions are formed on the protruded SEG layers 57, the channel length is increased. Accordingly, it is possible to further reduce the short channel effect.

Figure 12:
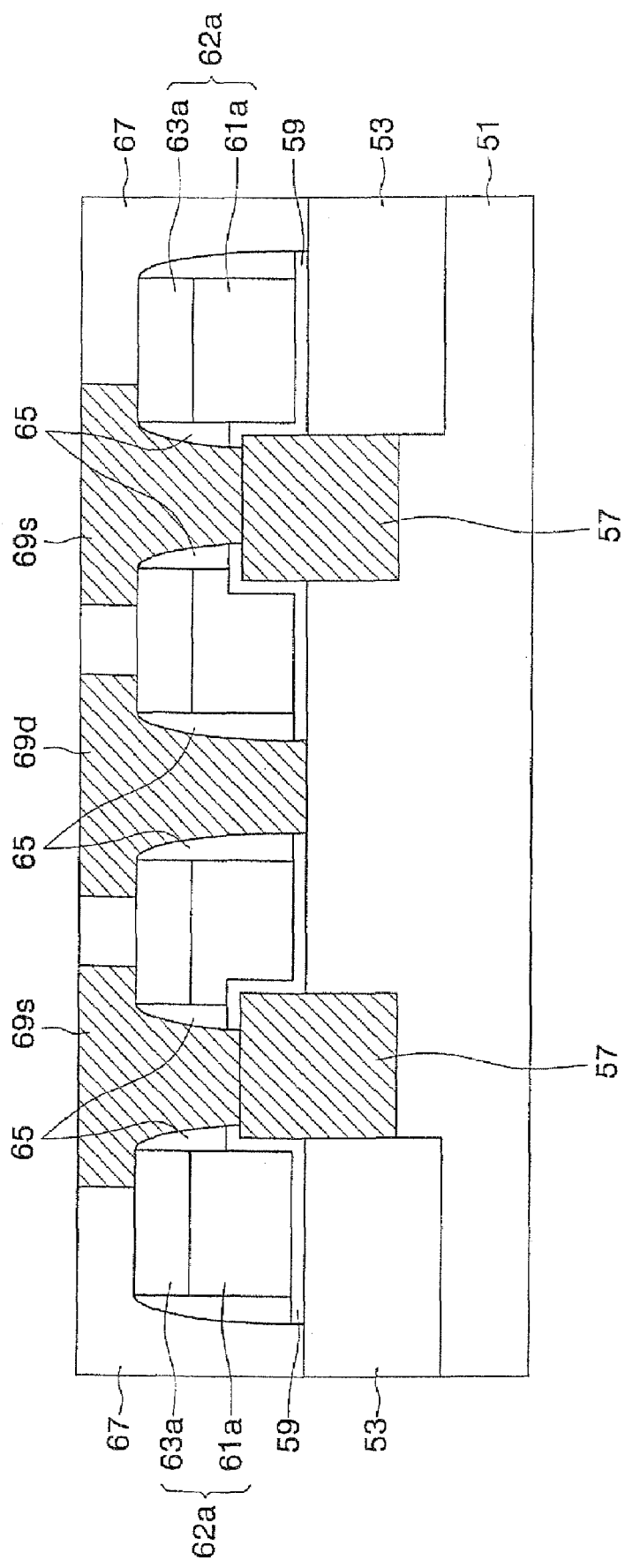

Referring to FIG. 12, an interlayer insulating layer 67 is formed on the semiconductor substrate having the source/drain regions. The interlayer insulating layer 67 may be formed of a silicon oxide layer.

Subsequently, contact holes exposing the source/drain regions are formed by patterning the interlayer insulating layer 67 as described with reference to FIG. 8. Next, source contact pads 69s and a drain contact pad 69d which fill the contact holes are formed. The source contact pads 69s are in contact with the protruded SEG layers 57.

In the case of a DRAM cell, the contact pads 69d and 69s are connected to a bit line and a capacitor for storing charges, respectively.

Hereinafter, an asymmetric source/drain transistor in accordance with another aspect of the invention will be explained in detail.

Referring back to FIG. 12, an active region is defined on a semiconductor substrate 51. The active region may be defined by an isolation layer 53.

Gate patterns 62a cross the active region. Each of the gate patterns 62a includes gate electrodes 61a and gate hard mask patterns 63a which are sequentially stacked. The gate electrode 61a may be a single-layer structure or a multi-layered structure. Preferably, the gate electrode 61a may be a multi-layered structure in which a polysilicon layer and a metal layer are sequentially stacked.

SEG layers 57a are disposed in the active region, and protrude from the top of the semiconductor substrate 51. The protruding SEG layers 57 may cover lower sidewalls of the gate patterns 62a. Also, the gate patterns 62a may overlap with at least some portion of the protruding SEG layers 57. A gate insulating layer 59 is interposed between the SEG layers 57 and the gate patterns 62a and between the gate patterns 62a and the semiconductor substrate 51.

Furthermore, spacers 65 cover sidewalls of the gate patterns 62a. One of the two spacers 65 covering each of the gate patterns 62a overlaps at least some portion of the protruding SEG layer 57. That is, one of the two spacers 65 associated with each of the gate patterns 62a covers at least some portion of the protruding SEG layer 57.

Meanwhile, source contact pads 69s and a drain contact pad 69d may be located adjacent to the sidewalls of the gate patterns 62s to be electrically connected to the protruding SEG layers 57 and the active region, respectively. That is, the source contact pads 69a are in contact with the SEG layers 57, and the drain contact pad 69d is in contact with the semiconductor substrate 51. Meanwhile, the contact pads 69d and 69s are electrically insulated from each other by an interlayer insulating layer 67. Also, the interlayer insulating layer 67 fills empty spaces between the gate patterns 62a.

According to another aspect of the invention, there is provided an asymmetric source/drain transistor in which a channel length is increased.

According to some embodiments of the invention, a method of fabricating an asymmetric source/drain transistor is capable of distributing channel ions asymmetrically with ease by employing an SEG layer. Also, according to aspects of the invention, there is provided an asymmetric source/drain transistor capable of distributing channel ions asymmetrically with ease by employing the SEG layer.

The invention may be practiced in many ways. What follows are exemplary, non-limiting descriptions of some embodiments of the invention.

According to some embodiments of the invention, a method of fabricating an asymmetric source/drain transistor employs a selective epitaxial growth (SEG) layer. The method includes preparing a semiconductor substrate having an active region. Channel ions are doped into the active region and a planarized SEG layer is formed in a predetermined region of the active region doped with the channel ions. Then, a gate insulating layer, a gate conductive layer and a gate hard mask layer are sequentially formed on the semiconductor substrate having the planarized SEG layer. The gate hard mask layer and the gate conductive layer are sequentially patterned to form a gate pattern crossing the active region. Here, the planarized SEG layer is located at one side of the gate pattern. Source/drain regions are formed by implanting impurity ions using the gate pattern as an ion implantation mask. Accordingly, the channel ions are asymmetrically distributed by diffusing the channel ions into the SEG layer. Thus, intensities of electric fields between a source region or a drain region formed in the SEG layer and a channel region is reduced so that the leakage current may be reduced.

Preferably, forming the planarized SEG layer may include forming a hard mask pattern having an opening exposing a predetermined region of the active region. A trench is formed by etching the exposed predetermined region using the hard mask pattern as an etching mask. The SEG layer to fill the trench is then form and the hard mask pattern is removed. Then, the SEG layer protruded from the top of the semiconductor substrate is planarized.

Meanwhile, the gate pattern may be formed to overlap at least some portion of the planarized SEG layer.

According to other embodiments of the invention, a method of fabricating an asymmetric source/drain transistor employs a selective epitaxial growth (SEG) layer. The method includes preparing a semiconductor substrate having an active region. Channel ions are doped in the active region. A hard mask pattern having an opening exposing a predetermined region of the active region is formed and a trench is formed by etching the exposed predetermined region using the hard mask pattern as an etching mask. Then, an SEG layer to fill the trench is formed. Here, the SEG layer is protruded from the top of the semiconductor substrate. Subsequently, the hard mask pattern is removed. A gate insulating layer, a gate conductive layer and a hard mask layer are sequentially formed on the semiconductor substrate having the protruded SEG layer, and a gate pattern crossing the active region is formed by sequentially patterning the gate hard mask layer and the gate conductive layer, wherein the protruded SEG layer is located at one side of the gate pattern. Then, source/drain regions are formed by implanting impurity ions using the gate pattern as an ion implantation mask. Accordingly, there is provided an asymmetric source/drain transistor capable of preventing a leakage current from flowing between the source region and the channel region near to the SEG layer. Furthermore, a source region is formed on the protruding SEG layer so that a channel length may be increased.

Preferably, the gate pattern may be formed to overlap at least some portion of the protruded SEG layer.

According to still other embodiments of the invention, an asymmetric source/drain transistor employs a selective epitaxial growth (SEG) layer. The transistor includes a semiconductor substrate having an active region. A gate pattern crosses the active region. Spacers cover sidewalls of the gate pattern. A gate insulating layer is disposed between the gate pattern and the active region, and an SEG layer is located in the active region. One of the spacers overlaps at least some portion of the SEG layer.

According to additional embodiments of the invention, an asymmetric source/drain transistor employs a selective epitaxial growth layer. The transistor includes a semiconductor substrate having an active region. A gate pattern crosses the active region. An SEG layer is disposed in the active region at one side of the gate pattern and protrudes from the top of the semiconductor substrate. A gate insulating layer is interposed between the gate pattern and the protruding SEG layer, and between the gate pattern and the active region. Meanwhile, spacers cover sidewalls of the gate pattern, and one of the spacers is overlaps the protruding SEG layer.

Exemplary embodiments of the invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

We claim:

1. A method of fabricating an asymmetric source/drain transistor, comprising:
    defining an active region in a semiconductor substrate using an isolation layer;
    doping channel ions in the active region;
    planarizing a selective epitaxial growth (SEG) layer disposed in a predetermined region of the active region that contains the channel ions;
    sequentially depositing a gate insulating layer, a gate conductive layer, and a gate hard mask layer on the semiconductor substrate having the planarized SEG layer;
    sequentially patterning the gate hard mask layer and the gate conductive layer to form a gate pattern crossing the active region, the planarized SEG layer located to one side of the gate pattern; and
    implanting impurity ions using the gate pattern as an ion implantation mask to form source/drain regions.

2. The method of fabricating the asymmetric source/drain transistor according to claim 1, further comprising, before planarizing the SEG layer:
   exposing the predetermined region of the active region with a hard mask pattern;
   etching the exposed predetermined region to form a trench using the hard mask pattern as an etching mask;
   filling the trench with the SEG layer; and
   removing the hard mask pattern.

3. The method of fabricating the asymmetric source/drain transistor according to claim 1, wherein the gate pattern is formed to overlap at least some portion of the planarized SEG layer.

4. The method of fabricating the asymmetric source/drain transistor according to claim 1, further comprising forming spacers covering sidewalls of the gate pattern, one of the spacers overlapping at least some portion of the planarized SEG layer.

5. The method of fabricating the asymmetric source/drain transistor according to claim 4, wherein the gate pattern is formed to overlap at least some portion of the planarized SEG layer.

6. The method of fabricating the asymmetric source/drain transistor according to claim 5, further comprising:
   depositing an interlayer insulating layer on the semiconductor substrate having the source/drain regions;
   patterning the interlayer insulating layer to form self-aligned contact holes that expose the source/drain regions; and
   filling the contact holes to form contact pads.

7. A method of fabricating an asymmetric source/drain transistor, comprising:
   defining an active region in a semiconductor substrate with an isolation layer;
   doping channel ions in the active region;
   exposing a predetermined region of the active region with a hard mask pattern;
   etching the predetermined region to form a trench using the hard mask pattern as an etching mask;
   filling the trench with a selective epitaxial growth (SEG) layer, the SEG layer protruding from a top of the semiconductor substrate;
   removing the hard mask pattern;
   sequentially depositing a gate insulating layer, a gate conductive layer, and a hard mask layer on the semiconductor substrate and the SEG layer;
   sequentially patterning the gate hard mask layer and the gate conductive layer to form a gate pattern crossing the active region, the SEG layer disposed to one side of the gate pattern; and
   implanting impurity ions to form source/drain regions using the gate pattern as an ion implantation mask.

8. The method of fabricating the asymmetric source/drain transistor according to claim 7, wherein the gate pattern is formed to overlap at least some portion of the protruded SEG layer.

9. The method of fabricating the asymmetric source/drain transistor according to claim 7, further comprising forming spacers covering sidewalls of the gate pattern, one of the spacers overlapping the SEG layer.

10. The method of fabricating the asymmetric source/drain transistor according to claim 9, wherein the gate pattern overlaps at least some portion of the SEG layer.

11. The method of fabricating the asymmetric source/drain transistor according to claim 10, further comprising:
   depositing an interlayer insulating layer on the semiconductor substrate having the source/drain regions;
   exposing the source/drain regions by patterning the interlayer insulating layer to form self-aligned contact holes; and
   filling the contact holes to form contact pads.

* * * * *